(12) United States Patent
Scofield

(10) Patent No.: US 6,359,782 B1
(45) Date of Patent: Mar. 19, 2002

(54) ENHANCED THERMAL DISSIPATION DEVICE FOR CIRCUIT BOARDS AND METHOD TO USE THE SAME

(75) Inventor: William Harold Scofield, Lombard, IL (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/567,517

(22) Filed: May 9, 2000

(51) Int. Cl.[7] .................................................. H05K 7/20
(52) U.S. Cl. ....................................... 361/689; 361/719
(58) Field of Search ............................. 165/80.3, 122, 165/185; 361/689–690, 694–695, 719–721

(56) References Cited

U.S. PATENT DOCUMENTS 5,103,374 A  *  4/1992  Azar ........................... 361/689

\* cited by examiner

Primary Examiner—Gregory Thompson

(57) ABSTRACT

The present invention provides for an apparatus for removal of thermal energy emitted from at least one electrical component positioned on a circuit board, in which a forced air stream is provided in a direction to flow over the circuit board and toward the at the least one electrical component which includes a rod having an elongated dimension in which the elongated dimension is positioned transverse to the direction of the forced air stream, upstream from the at least one electrical component and spaced apart from a plane defined by the circuit board. The present invention provides for a method for removal of thermal energy emitted from at least one electrical component positioned on a circuit board in which a forced air stream is provided and directed to flow over the circuit board and toward the at least one electrical component which includes the step of providing a rod having an elongated dimension and positioning the rod in the forced air stream with the elongated dimension transverse to the direction of the forced air stream, upstream to the at least one electrical component and spaced apart from a plane defined by the circuit board.

20 Claims, 3 Drawing Sheets

ENHANCED THERMAL DISSIPATION DEVICE FOR CIRCUIT BOARDS AND METHOD TO USE THE SAME

TECHNICAL FIELD

This invention relates generally to a device that removes thermal build-up generated from the operation of electrical components on a circuit board and more particularly, to the removal of thermal build-up from the operation of electrical components on a circuit board utilizing a forced air stream.

BACKGROUND OF THE INVENTION

It is known that energized electrical components positioned on a circuit board generate a significant amount of heat. In most industries, such as the telecommunications industry, there is a need to place higher output electronic devices on already congested circuit boards. Higher clock speed and higher density interconnects lead inevitably to higher power densities on a chip. The resultant byproducts of the high output devices are high levels of thermal dissipation from the chip or component and the immediately surrounding atmosphere to the component. These high levels of thermal energy being dissipated to the immediate surrounding environment are problematic to maintaining effective operation and optimum life of surrounding electrical components.

Higher output devices are known to utilize an increased number of multi-chip modules, increased surface circuit board mounting technology such as mezzanine boards, and reduced package dimensions all of which exacerbate the problem of the undesirable thermal build-up from the thermal dissipation of energized electrical components residing on the circuit board(s). With power per unit area on circuit boards as much as quadrupling over less than the past decade, thermal design issues have arisen that as recently as five years ago were not even comprehended or contemplated.

As mentioned above, a contributing problem to thermal build-up is the utilization of mezzanine arranged or stacked circuit boards. The increased use of mezzanine boards has come about with the increase of clock speeds and shorter lead traces, the circuit designers have needed to shorten the electrical path between components enabling quicker response time of the electronics. The negative side of these arrangements is there is an increase of power density from the electrical components on the circuit boards thereby releasing heat energy in a relatively smaller area. Therefore, there is an increasing need to remove this thermal energy away from the proximity of the electrical components and not allow the dissipated energy to build-up on localized areas of the circuit boards and the surrounding electrical components. Failure to remove the undesirable thermal build-up can place the die of an integrated circuit component at critical elevated temperatures that either temporarily or permanently damage the components.

Another problem has been created with the closer positioning of the circuit boards to one another in a stacked or mezzanine arrangement. This problem is based on radiation energy generated from high-energy dies on a circuit board. Normally a circuit board with a centralized die will experience lower temperatures at the edges of the circuit board and greater temperatures at the location of the die. Radiation may be a major heat transfer mechanism for outer space applications but is generally negligible where the circuit board is positioned in a forced air convection system. However, with closer positioning of the components within a mezzanine arrangement of circuit boards, radiation of energy from these high energy components will further lead to thermal build-up.

Moreover, these compact circuit arrangements pose yet additional problems. Regardless of the components being positioned within a forced air stream, the tight arrangements of the components increases the air stream flow resistance thereby blocking the air flow and reducing its thermal dissipation capabilities based on convection from the forced air stream.

As a result of utilizing higher energy components that are more densely arranged upon a circuit board and positioning multiple circuit boards in closer proximity to one another, thermal build-up has become a problem, regardless of the use of forced air streams flowing over the circuit boards.

SUMMARY OF THE INVENTION

The problems noted above are resolved by providing the apparatus and method of the present invention.

The invention provides apparatus for removal of thermal energy emitted from at least one electrical component positioned on a circuit board, in which a forced air stream is provided in a direction to flow over the circuit board and the at least one electrical component including a rod having an elongated dimension, in which the elongated dimension is positioned transverse to the direction of the forced air stream, upstream from the at least one electronic component and spaced apart from a plane defined by the circuit board.

This invention also provides a method for removal of thermal energy emitted by at least one electrical component positioned on a circuit board which has a forced air stream provided and directed to flow over the circuit board and the at least one of the electrical components including the steps of providing a rod having an elongated dimension and positioning the rod in the forced air stream with the elongated dimension transverse to the direction of the forced air stream, upstream to at least one of the electrical components and spaced apart from a plane defined by the circuit board. Turbulence is imparted to the forced air stream by the rod and thereby provides a movement of the air stream that enhances the removal of heat energy emitted by the activated electrical component.

BRIEF DESCRIPTION OF THE DRAWINGS

The foregoing advantageous features of the invention will be explained in greater detail and others will be made apparent from the detailed description of the present invention that is given with reference to the several figures of the drawing, in which.

DETAILED DESCRIPTION

Figure 1:
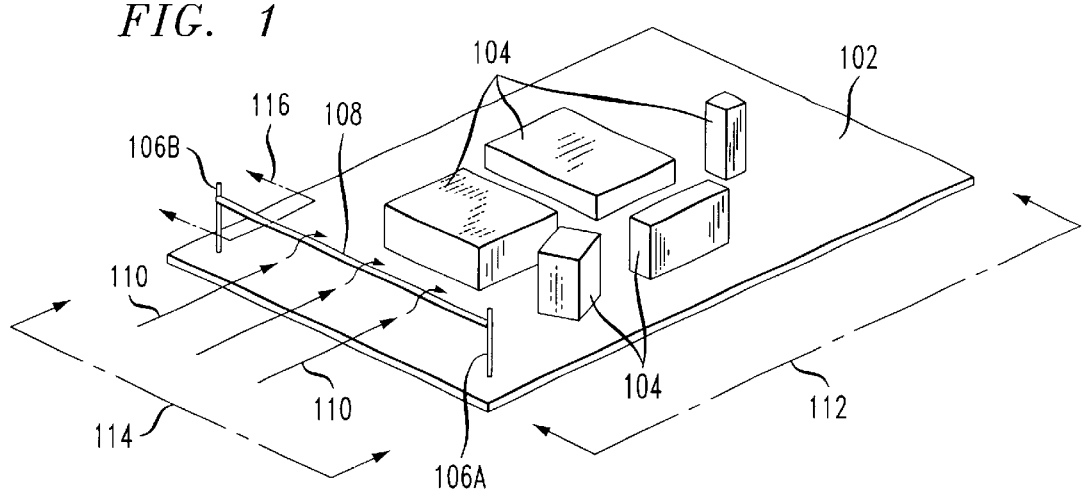
FIG. 1 is a perspective view of the invention.

Referring to FIG. 1, a perspective view of a circuit board 102 shows a number of electrical components 104 coupled to the circuit board 102. Two securement members 106A and 106B, shown as posts, are secured to the circuit board 102 and secure rod 108 spaced apart from a plane defined by the circuit board 102 and position it generally parallel to circuit board 102. A forced air stream 110 flows over the circuit board 102 and toward the electrical components 104. Rod 108 has an elongated dimension between the support members 106A and 106B. The elongated dimension of the rod 108 is positioned transverse to the forced air stream 110 and results in an increased turbulent air flow. Additionally, the rod 108 has a circular cross section that creates vortices in the turbulent air flow.

Two smooth cylinder rod examples of 1/8 41 and 1/4" diameter were utilized in tests and will be discussed, with the understanding that other diameters of the cylindrical obstruction to laminar air flow are alternate embodiments of this invention. Moreover, other shapes of rods are also contemplated.

The velocity of the free air stream flow can be used to determine the drag force, caused by the cylinder rod obstructing the forced air stream flow, as well as the frequency of the shedding vortices in the wake field downstream from the rod. The net force of the air stream flow on the cylinder rod is the drag force aligned with the flow direction. The drag force and the wake property, momentum thickness, hold an important relationship thus enabling a calculation of the drag from the momentum thickness. The drag force is a combination of both pressure and frictional forces. The relative contributions of the friction drag force however decrease with increasing Reynolds number (Re). At Re≈1000 the friction drag is about 5% of the total drag. The Reynolds number is defined as stated in Equation:

$$Re = \frac{\rho \mu_0 d}{\mu}$$

Where:
 $\rho$=density of air;
 $\mu_0$=free stream flow velocity
 d=cross sectional diameter of the object at right angles to the flow; and
 $\mu$=fluid kinematic viscosity.

If the forced air stream is considered to be incompressible (valid because the flow speed is less than 0.3 Mach) and viscous, the viscous forces in the boundary layer acts to retard the flow. The flow velocity reduces to zero at a stagnation point. Energy of the forced air stream is conserved; therefore a decrease in velocity is accompanied by the increase in pressure at the stagnation point. The pressure differential causes the forced air stream along the boundary of the obstruction to increase in velocity causing a reduction in pressure. The pressure difference is the main contributor to the drag force for flow in the range of:

$$10^3 < Re < 3 \times 10^5$$

The formation of a boundary layer reduces the flow and causes a reduction in the momentum flux. The momentum thickness ($\theta$) is defined as the thickness of a layer of fluid (forced air) with a specific velocity for which the momentum flux is equal to the deficit of momentum flux through the boundary layer. This is an integral thickness defined in Equation 2 below and will be used to determine the calculated drag forces on the cylinder rod.

$$\theta = d \int_{-\infty}^{\infty} \left[ \frac{u_w}{u_0} - \left(\frac{u_w}{u_0}\right)^2 \right] d\left(\frac{y}{d}\right)$$

Where:
 $\theta$=momentum thickness;
 d=cylinder diameter;
 $u_0$=free stream velocity;
 $u_w$=wake velocity; and
 y=vertical displacement.

The drag force is calculated theoretically from the equation for drag force:

$$F_D = C_D A \rho \frac{u_0^2}{2}$$

Where:
 $F_D$=drag force;
 $C_D$=coefficient of drag;
 A=projected area of a cylinder perpendicular to the forced air stream;
 $\rho$=density of air; and
 $u_0$=free stream flow velocity.

Or the drag force can be calculated theoretically from the momentum thickness of the wake:

$$F_D = \rho u_0^2 \theta w$$

Where:
 $F_D$=drag force;
 $\theta$=momentum thickness
 w=width of the surface perpendicular to flow;
 $\rho$=density of air; and
 $u_0$=free stream flow velocity.

The Strouhal number (St) is a nondimensionalized number that relates the frequency of oscillation to the free stream velocity and the cylinder diameter. The equation below is used to determine the frequency of shedding vortices that form downstream from the cylinder rod:

$$St \equiv \frac{fd}{u_0}$$

Where:
 St=Strouhal number;
 f=frequency of oscillation; and
 $u_0$=free stream flow velocity.

Thus the fundamental characteristics of a cylinder rod in an air stream flow include drag force, velocity profile, and shedding frequency for the forced air stream across a cylinder rod and are determinable. Furthermore, the turbulent air flow that is created by the cylinder rod results in vortices that allow more cool air to interact with the surfaces of the electrical components 104 on the circuit board 102.

Figure 2:
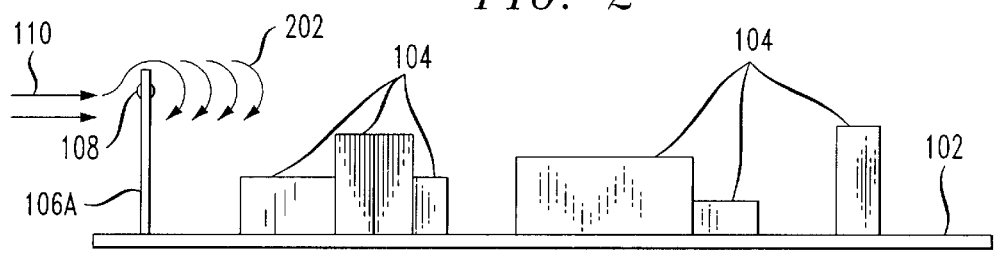
FIG. 2 is a side elevation view of the invention as seen along line 112 in FIG. 1.

In FIG. 2, a side elevation view of the invention as seen along line 112 of the circuit board 102, FIG. 1, is shown. The circuit board 102 has a plurality of electrical components 104 and post 106A can be seen. Posts 106A and 106B are spaced apart to one another and are positioned proximate to and secured to an edge of circuit board 102 upstream from electrical components 104. The cross section of rod 108 is identifiable as being circular in shape. The rod is in the path of the forced air stream 110 and when encountered by the forced air stream 110 a turbulent air stream 202 results. The turbulent air stream 202 contacts the circuit board and electrical components more efficiently with imparting a vertical component to the air flow relative to the plane of the circuit board than if a laminar air flow passing over the circuit board resulting in greater heat transfer and longer electrical component life. It is often desired to position rod 108 at a sufficient elevation over circuit board 102 so as to be above electrical components 104 to optimize the effect of the turbulent air flow.

Figure 3:
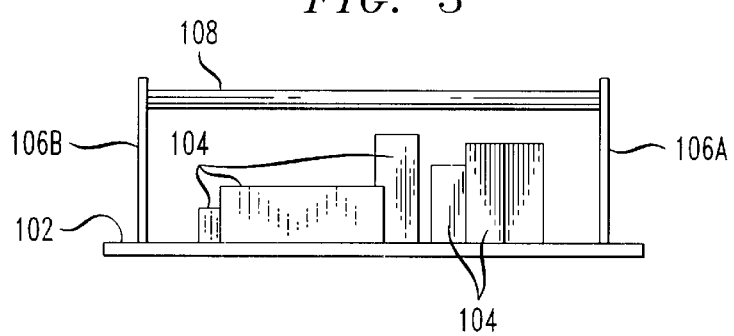
FIG. 3 is a front elevation view of the invention as seen along line 114 in FIG. 1.

In FIG. 3, a front elevation view as seen along line 114 of the circuit board 102, FIG. 1, is shown. The two posts 106A and 106B are spaced apart with rod 108 positioned between the two posts and likewise secured to the posts. Rod 108 is supported by the two post 106A and 106B and secured thereto by any number of ways such as gluing, providing a snap fit or utilizing any other known securement. Rod 108 is positioned and is secured to the posts 106A and 106B at a height above the electrical components 104. The height of the rod 108 enables the vortices of the turbulent air stream to flow over and around the electrical components coupled to the circuit board resulting in more efficient cooling than a traditional laminar air stream.

Figure 4:
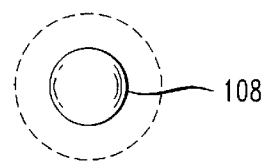
FIG. 4 is an enlarged cross section view as seen along 116 in FIG. 1.

Turning to FIG. 4, an enlarged cross section view of rod 108 as seen along 116 in FIG. 1 is shown. Rod 108 in the current embodiment is a wire, but in alternate embodiments other cylindrical material may be used, such as fiberglass rod, metal rods, plastic, or any other material that create a turbulent air stream. Rod 108 is round in the current embodiment, but in other embodiments other shapes may selectively be used.

Figure 5:
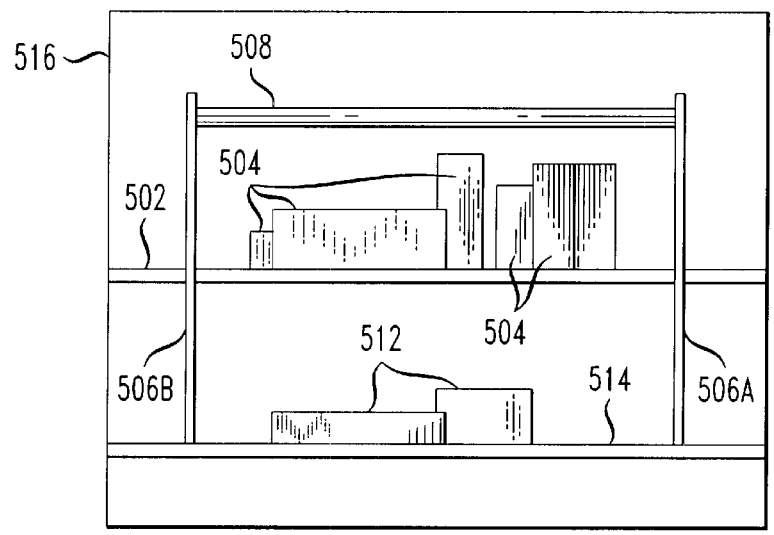
FIG. 5 is a front elevation view of another embodiment of the invention.

In FIG. 5, a front elevation view of another embodiment of the invention is shown. A circuit board 502 with electronic components 504 is positioned and held in a housing 506. The circuit board 502 in housing 516 is spaced apart from another circuit board 514 with other electrical components 512 secured thereto. The other circuit board 508 has two support members 506A and 506B that are spaced apart and of sufficient height to support rod 508 above electrical components 504 on the circuit board 502.

Figure 6:
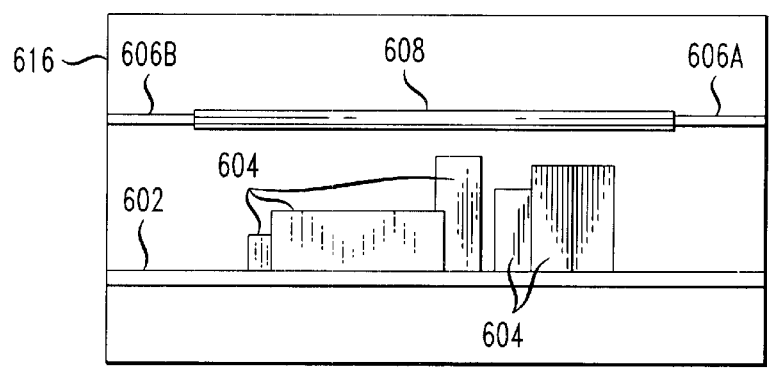
FIG. 6 is a front elevation view of another embodiment of the invention.

In FIG. 6, a front elevation view of another embodiment of the invention is shown. A housing 616 containing a printed circuit board 602 with electrical components 604 secured thereto. Housing 616 has two supports 606A and 606B for supporting a rod 608 above electrical components 604 and in the forced air stream.

Figure 7:
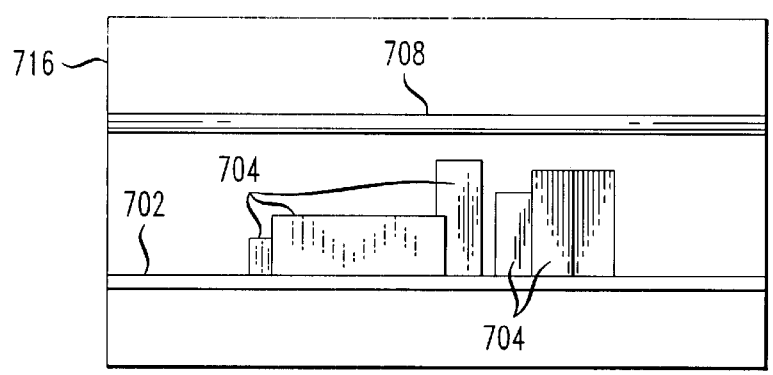
FIG. 7 is a front elevation view of another embodiment of the invention.

Turning to FIG. 7, a front elevation view of another embodiment of the invention is shown. Circuit board 702 having electrical components 704 is contained within housing 716. Housing 716 also supports rod 708 that is secured directly to the walls of the housing 716. In an alternate embodiment rod 708 is integral with housing 716. Rod 708 is positioned in the present embodiment above the electronic components, such that the laminar air flow becomes a turbulent air flow upon contact with the rod 708. Once again, rod 708 is secured to housing 706 utilizing numerous securements such as being integral, glued or supported by an opening in housing 716 as well as or other common ways of securement.

Figure 8:
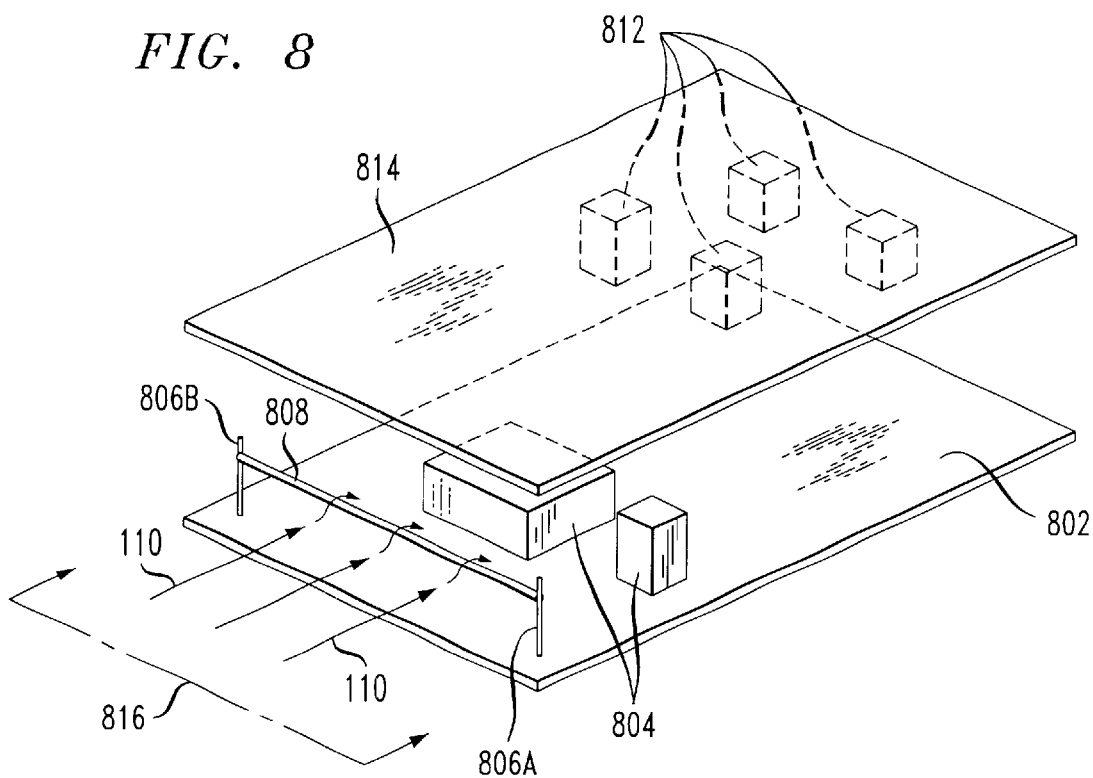
FIG. 8 is a perspective view of the invention with a mezzanine circuit board arrangement.

In FIG. 8, a perspective view of the invention with a mezzanine circuit board arrangement of a first circuit board 802 with electrical components 804 and a second circuit board 814 with other electrical components 812 secured thereto. The second circuit board 814 overlies the first circuit board 802 creating a mezzanine circuit board arrangement. Rod 808 is in the upstream path of the forced air stream 110 from the electrical components 804 and other electrical components 812 and is spaced apart from planes defined by first circuit board 802 and second circuit board 814. Rod 808 is supported in the present embodiment by two support members 806A and 806 B. Rod 808 may be supported by numerous ways as discussed previously. In this example, the support members 806A and 806B are coupled to first circuit board 802. As laminar air encounters rod 808, it is disrupted and becomes a turbulent forced air stream. The turbulent forced air stream has vortices of rotating air that has a vertical component relative to the plane defined by the circuit boards 802, 814 and results in more efficient cooling of the electrical components on both circuit boards 802 and 814.

Circuit boards 802 and 814 in a mezzanine arrangement have a velocity boundary layer that greatly affects the fluid velocity (air velocity). When fluid particles make contact with a surface, they assume zero velocity. These particles then act to retard the motion of the particles in the adjoining fluid layer, which act to retard the motion of the particles in the next boundary layer, and so on until, at a distance from the surface, the effects becomes negligible. This effect becomes even more dramatic when the flow is between two parallel plates, as in the mezzanine arrangement. In this case the boundary layer thickness associated with each plate comes into contact with the other. In the case of gases, the Prandtl number is $Pr \approx 1$. Because the boundary layers come in contact they are prevented from growing. This is unfortunate because fully developed turbulent flow is significantly increased when the boundary layer thickness increases. In the fully developed region highly random three-dimensional motion of relatively large parcels of fluid move freely within the boundary layer that increases the heat transfer from the surface to the free stream fluid. However, the fluid in the compacted boundary layer can be forced to a turbulent state.

For example, the fluid flow can be modified by the introduction of a cylindrical rod. The rod placed in the cross flow will cause the flow in its wake to shed vortices at regular frequency. The shedding vortices increase the random three-dimensional motion and thus improve the transfer of heat. The Nusselt number is a dimensionless parameter describing the radiant at the surface and provides a measure of the convection heat transfer occurring at the surface. The Nusselt number is a function of the Prandtl and Reynolds numbers. The Reynolds number is strongly effected by the fluid velocity and hence the design of the system in which the mezzanine arrangement will be used. For laminar flow the Nusselt number is:

$$N_u = 0.664 Re^{1/2} Pr^{1/3}$$

Where Re was given by the Reynolds equation and Pr is 0.707 for air at sea level.

While for turbulent flow the Nusselt number is:

$$N_u = 0.137 Re^{4/5} Pr^{1/3}$$

Where Re was given by the Reynolds equation and Pr is 0.707 for air at sea level.

Therefore heat transfer rate is calculated by the equation:

$$h = \frac{N_u k}{L}$$

Where:
 h=heat transfer coefficient,
 Nu=Nusselt number,
 k=fluid thermal conductivity and;
 L=length of the plate
The heat transferred from the circuit board to the free flowing fluid can be calculated by the equation:

$$q = hA(T_S - T_\infty)$$

Where:
 q=heat transfer,
 h=heat transfer coefficient,
 A=surface area
 $T_S$=surface temperature and;
 $T_\infty$=fluid free stream temperature.
Now for a given set of conditions we can compare the amount of heat transferred in laminar and turbulent conditions. Let A=1{$m^2$}, ($T_S - T_\infty$)=40, Re=10,000, k=0.0364{W/mK}, and L=0.1 {m}, then using the above equations:
 For laminar conditions q=861 Watts.
 For turbulent conditions q=2816 Watts
Therefore, more heat is transferred to the environment, lowering the temperature of the mezzanine arrangement of circuit boards 802, 814 and increasing the life of the electrical components 804, 812.

Figure 9:
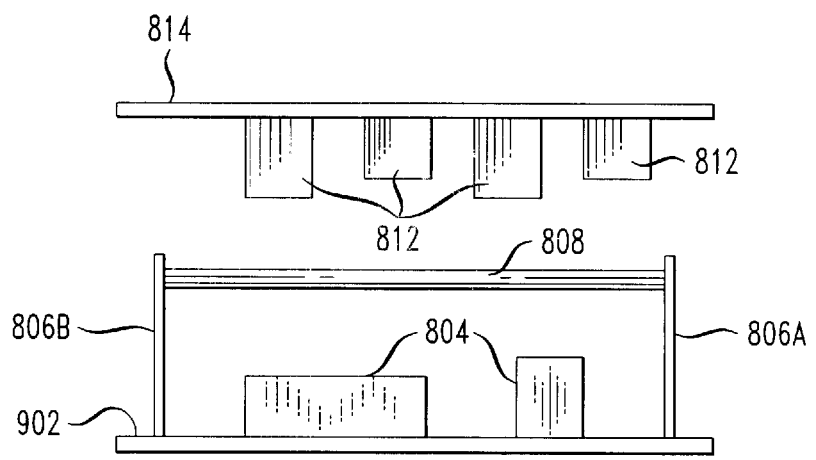
FIG. 9 is a front elevation view as seen along line 816 in FIG. 8.

In FIG. 9, a front elevation view of the mezzanine circuit board arrangement as seen along line 816 in FIG. 8 is shown. First circuit board 802 with electrical components 804 extends towards second circuit board 814. Similarly, the other electrical components 812 on second circuit board 814 extend towards the first circuit board 802. Rod 808 is secured to posts 806A and 806B (securement members) and placed upstream from all of electrical components 804, 812. Thus laminar air flow becomes turbulent upon contacting and interacting with rod 808.

The present invention includes providing a method for removal of thermal energy emitted by at least one electrical component 104 positioned on circuit board 102 in which a forced air stream 110 is provided and directed to flow over circuit board 102 and toward the at least one electrical component 104. The method includes providing rod 108 having an elongated dimension and positioning rod 108 in forced air stream 110 with the elongated dimension transverse to the direction of forced air stream 110 and upstream to the at least one electrical component 104, as seen in FIGS. 1 and 2. Even though other shapes of rods are contemplated, the step of providing includes selecting rod 108 having a circular cross section. In the step of positioning is included placing rod 108 generally parallel to a plane defined by circuit board 102, as well as, positioning rod 108 at an elevation above the elevation of the at least one electrical component 104 which extends above circuit board 102.

The step of positioning rod 808 in forced air stream 110 with elongated dimension transverse to the direction of forced air stream 110 and upstream to another of at least one electrical component 812 positioned on another circuit board 814, as seen in FIGS. 8 and 9, and spaced apart from another plane defined by other circuit board 814. The step of positioning also includes placing rod 808 between two planes defined by circuit boards 802 and 814.

In addition, a step of orienting involves circuit board 802 and other circuit board 814 to have at least one electrical component 104 positioned on circuit board 802 extending in a direction toward the other circuit board 814 and the other at least one electrical component 812 positioned on the other circuit board 814 extending in a direction toward circuit board 802, as seen in FIGS. 8 and 9.

While a description of the preferred embodiments of the invention has been given, it shall be appreciated that many variations can be made thereto without departing from the scope of the invention as set forth in the appended claims.

What is claimed is:

1. An apparatus, wherein a forced air stream is provided in a direction to flow over a circuit board and toward at least one electrical component disposed on the circuit board, the apparatus comprising:
 a rod having an elongated dimension in which the elongated dimension is positioned transverse to the direction of the forced air stream and upstream from the at least one electrical component and spaced apart from a plane defined by the circuit board such that removal of thermal energy emitted from the at least one electrical component results; and
 at least one securement member, operably coupled to the rod, such that the securement member supports the rod within the forced air stream, wherein the securement member is a housing associated with the circuit board.

2. The apparatus of claim 1, in which the rod has a cross section that is circular.

3. The apparatus of claim 2 in which the rod has at least a portion that is cylindrical in shape.

4. The apparatus of claim 1 in which the rod is a wire.

5. The apparatus of claim 1, in which the at last one securement member is a post.

6. An apparatus, wherein a forced air stream is provided in a direction to flow over a circuit board and toward at least one electrical component disposed on the circuit board, the apparatus comprising:
 a rod having an elongated dimension in which the elongated dimension is positioned transverse to the direction of the forced air stream and upstream from the at least one electrical component and spaced apart from a plane defined by the circuit board such that removal of thermal energy emitted from the at least one electrical component results; and
 a housing for the circuit board, operably coupled to the rod, such that the housing supports the rod within the forced air stream.

7. The apparatus of claim 1, further including at least two securement members spaced apart from one another.

8. The apparatus of claim 1, in which the at least one securement member is positioned proximate to an edge of the circuit board and upstream from the electrical components.

9. The apparatus of claim 1 in which the rod is positioned generally parallel to a plane defined by the circuit board.

10. The apparatus of claim 1, in which the rod is positioned at an elevation relative to the circuit board above the at least one electrical component positioned on the circuit board.

11. The apparatus of claim 1, in which the securement member is at least a part of a wall of the housing.

12. The apparatus of claim 1, further including a second circuit board having at least another electrical component positioned on the second circuit board, in which the second circuit board overlies and is spaced apart from the circuit board, in which the rod is disposed between a plane defined by the second circuit board and the plane defined by the circuit board, and in which the rod is positioned upstream from the at least another electrical component positioned on the second circuit board.

13. The apparatus of claim 12 in which the at least one electrical component of the circuit board extends in a direction toward the second circuit board and the at least another electrical component of the second circuit board extends in a direction toward the circuit board.

14. A method comprising the steps of:

providing a rod having an elongated dimension; and positioning the rod in a forced air stream with the elongated dimension transverse to the direction of the forced air stream and upstream to at least one electrical component disposed on a circuit board and spaced apart from a plane defined by the circuit board such that removal of thermal energy emitted from the at least one electrical component results; and supporting, with a housing associated with the circuit board, the rod within the forced air stream.

15. The method of claim 14 in which the step of providing includes selecting a rod having a circular cross section.

16. The method of claim 14 in which the step of positioning includes placing the rod generally parallel to the plane defined by the circuit board.

17. The method of claim 14 in which the step of positioning includes placing the rod at an elevation above the elevation of the at least one electrical component that extends above the circuit board.

18. The method of claim 14 in which the step of positioning includes positioning the rod in the forced air stream with the elongated dimension transverse to the direction of the forced air stream and upstream to at least another electrical component positioned on an other circuit board and spaced apart from another plane defined by the other circuit board.

19. The method of claim 18 in which the step of positioning includes placing the rod between the two planes that define the circuit board and other circuit board.

20. The method of claim 18, further including the step of orienting the circuit board and the other circuit board the at least one electrical component positioned on the circuit board extends in a direction toward the other circuit board, and the at least another electrical component positioned on the other circuit board extends in a direction toward the circuit board.

* * * * *